United States Patent
Bewig et al.

(10) Patent No.: US 7,533,628 B2
(45) Date of Patent: May 19, 2009

(54) VOLUME-OPTIMIZED REACTOR FOR SIMULTANEOUSLY COATING EYEGLASSES ON BOTH SIDES

(75) Inventors: Lars Bewig, Bad Gandersheim (DE); Thomas Küpper, Bad Gandersheim (DE)

(73) Assignee: Schott AG, Mainz (DE)

( * ) Notice: Subject to any disclaimer, the term of this patent is extended or adjusted under 35 U.S.C. 154(b) by 173 days.

(21) Appl. No.: 10/319,754

(22) Filed: Dec. 13, 2002

(65) Prior Publication Data
US 2003/0148041 A1 Aug. 7, 2003

(30) Foreign Application Priority Data
Dec. 13, 2001 (DE) .................. 101 61 469

(51) Int. Cl.
*C23C 16/00* (2006.01)
*H01L 21/306* (2006.01)

(52) U.S. Cl. .................. 118/723 MW; 156/345.41

(58) Field of Classification Search ......... 118/723 MW, 118/723 ME, 723 MA, 723 MR; 156/345.36, 156/345.41, 345.42
See application file for complete search history.

(56) References Cited

U.S. PATENT DOCUMENTS 6,010,755 A * 1/2000 Suzuki .................. 427/571
6,025,013 A * 2/2000 Heming et al. .............. 427/9

FOREIGN PATENT DOCUMENTS

DE 44 14 083 10/1995

* cited by examiner

*Primary Examiner*—Luz L. Alejandro
(74) *Attorney, Agent, or Firm*—Baker & Daniels LLP

(57) ABSTRACT

A reactor for simultaneous coating of eyeglasses on both sides thereof. Two partial devices are provided, each with a microwave energy waveguide, a gas supply and an apparatus for evacuating the coating chamber where the first and second devices can be moved relative to each other to open and close the coating chamber. The coating chamber itself is removable from the device and includes two gas supply connections and two connections for evacuating the coating chamber as well as microwave windows for coupling in microwave energy.

24 Claims, 2 Drawing Sheets

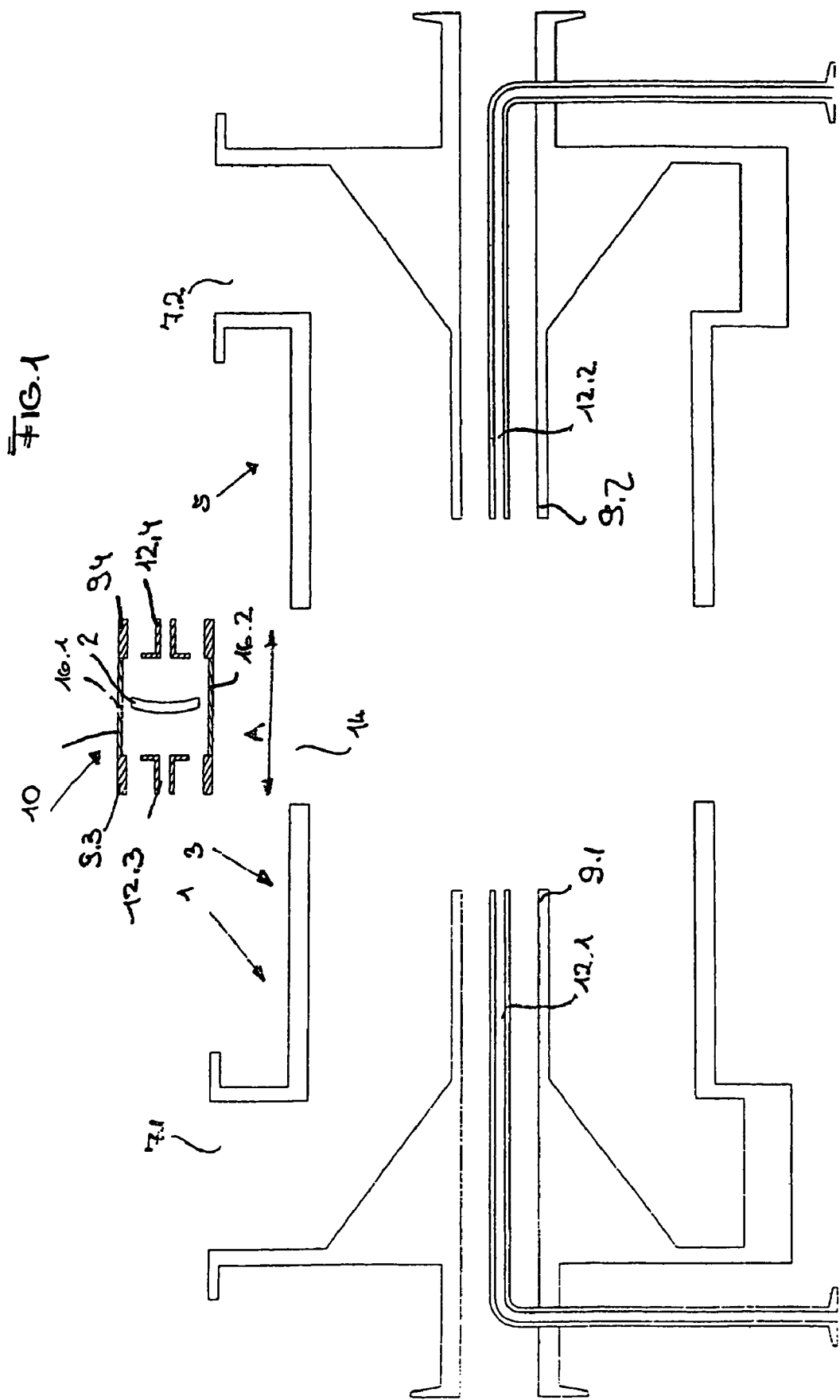

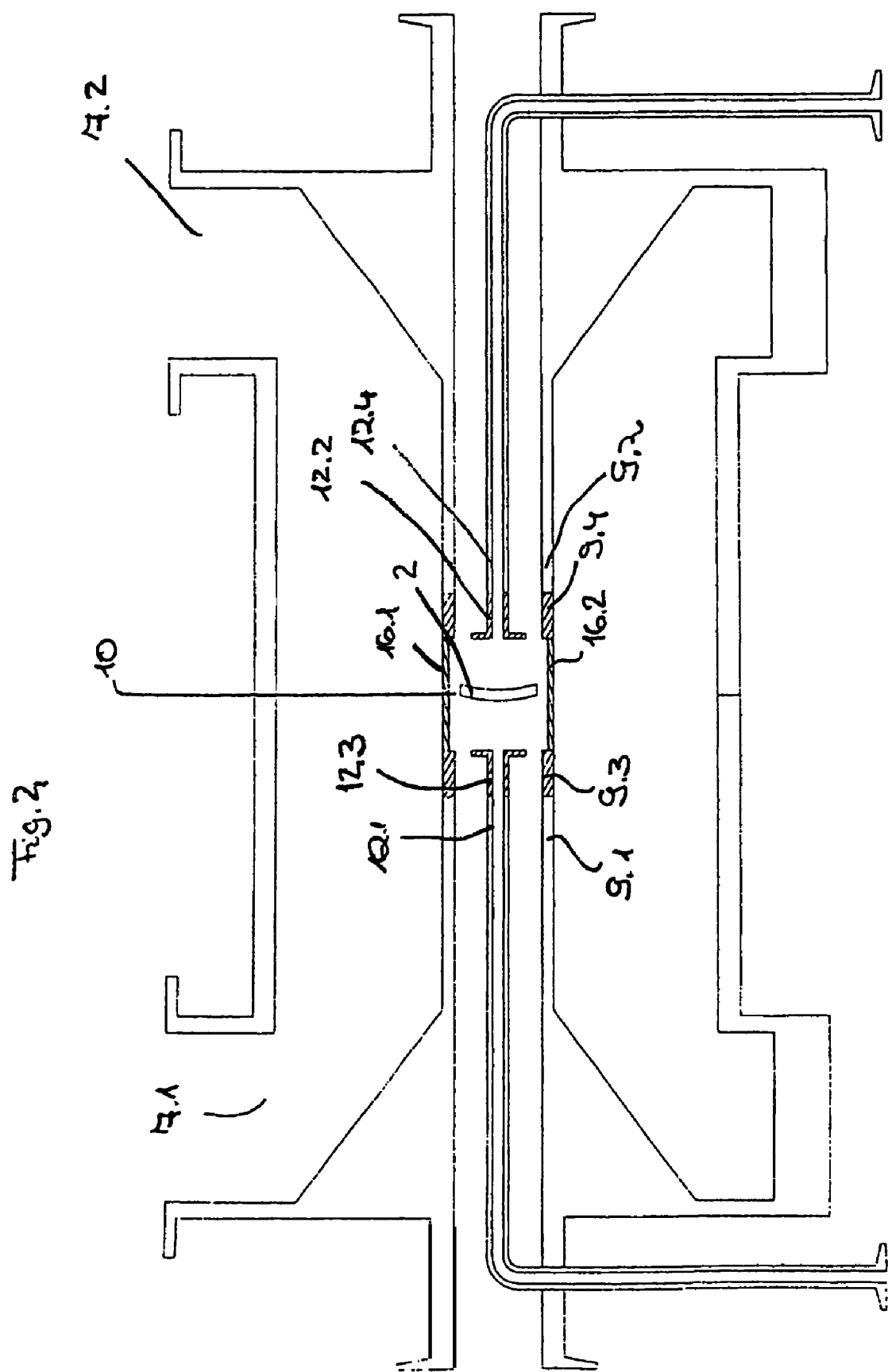

VOLUME-OPTIMIZED REACTOR FOR SIMULTANEOUSLY COATING EYEGLASSES ON BOTH SIDES

BACKGROUND OF THE INVENTION

Coating reactors are being used for the coating of substrates, having a bottom part, a top part and side walls, a supply line for gaseous media into the interior of the coating reactor and microwave windows for coupling in high-frequency energy or microwave energy by means of which a plasma is ignited in the interior of the reactor. The microwave energy is preferably pulsed microwave energy. A device and a method for coating a substrate by means of pulsed microwave energy is disclosed in DE 38 30 249 C2, for example.

DE 44 14 0831 A1 describes a device for producing thin films on plastic substrates by means of gas phase deposition via low pressure plasma with two diametrically opposed sources and a coating chamber in which the substrates are held between the range of action of both sources.

U.S. Pat. No. 6,010,755 describes a coating apparatus for applying protective layers on a magnetic memory device, where an ECR plasma is generated in a vacuum chamber and where the ECR plasma is coupled in from opposite sides.

All of the devices according to prior art are disadvantageous in that inhomogeneous coatings are deposited, especially in the edge areas, the coating conditions vary from one substrate to be coated to the next and therefore they are difficult to reproduce, and the volume of such reactors is relatively large, so that the gas exchange times, and thus the process times are relatively long. Another disadvantage of the devices according to prior art is that variations in the coating thickness cannot be prevented.

Therefore, the aim of the invention is to provide a device for coating substrates with which the above mentioned disadvantages are prevented.

SUMMARY OF THE INVENTION

According to the invention, the problem is solved by means of a device characterized in that the waveguides for coupling in microwave energy, the gas supply apparatus and the apparatus for evacuating the coating chamber are disposed coaxial relative to each other. Problems of uniformity in coating can be prevented with such a coaxial arrangement in a type of tubular reactor with coaxial microwave, gas and vacuum coupling. Another advantage of such an arrangement is that it is able to operate with a relatively small reactor volume preventing unnecessarily long gas exchange times and thus process times.

The coating reactor or coating chamber can be especially easily loaded with a substrate to be coated when the device for the coating of substrates comprises two partial devices, each with a waveguide for coupling in microwave energy, a gas supply apparatus and a apparatus for evacuating the coating chamber, where the first and second partial devices can be moved relative to each other, and where by means of such moving a coating chamber can be opened or closed. The coating chamber itself is an apparatus which is removable from the device for the coating of substrates, preferably comprising two gas supply connections and two connections for evacuating the coating chamber and microwave windows for coupling in microwave energy. When the two partial devices are moved apart, the coating chamber can be removed, loaded outside the device for the coating of substrates and then placed in the device for the coating of substrates. Then, the two partial devices are closed, the coating chamber is evacuated, the gas and precursor gas are introduced and the plasma can be ignited in the coating chamber so as to coat the substrate loaded outside the coating device. When the coating process is completed, the two partial devices can be moved apart again, the coating chamber can be removed and the coating reactor can be unloaded outside the coating device.

Such an exchangeable coating chamber is advantageous in that the coating conditions are reproducible for any substrate to be coated.

For example, with such a coating chamber, the microwave windows, which are preferably part of the coating chamber itself, can be replaced before each new coating so as to prevent that the microwave windows are also coated by each coating, as they are according to prior art, which causes the dielectric constant and thus the coating conditions to change from one coating to the next. Therefore, the invention achieves that the coating conditions can be set so as to be reproducible for any coating process of an eyeglass. The coating chamber of the invention can be made as a disposable chamber, which means a coating chamber which is discarded every time a coating is completed. Alternatively, the coating chamber could be cleaned after each coating so that a coating deposited on the microwave windows is removed every time a coating is completed.

It is especially preferable that the coating chamber is configured in a tubular form where the first and the second gas supply apparatus and the first and the second apparatus for evacuating the coating chamber are disposed opposite each other, and with a tubular coating chamber that they are predominantly disposed coaxial relative to the tube axis. A tubular coating chamber is advantageous in that it is rotational and that it has the same symmetry as the object to be coated, thereby achieving an especially uniform coating.

However, the invention is not limited to tubular or rotation-symmetrical coating chambers. Other geometries are also conceivable.

Preferably, the substrate to be coated is a planar or curved substrate with a maximum diameter or a maximum edge length of the substrate of 15 cm. The substrate to be coated is usually an eyeglass substrate or a lens substrate.

BRIEF DESCRIPTION OF THE DRAWINGS

An example of the invention will be described below by means of the drawings, as follows:

FIG. 1 is a device in one form of the invention pulled apart for loading,

FIG. 2 is a device in one form of the invention in loaded state for coating a substrate.

DETAILED DESCRIPTION

FIG. 1 shows a device 1 of the invention for coating a substrate 2, which in the present case is a curved substrate 2, for example a lens substrate or an eyeglass substrate. The device 1 consists of two partial devices 3, 5 which can be moved in the direction of the tube axis A.

Each of the two partial devices 3, 5 comprises a waveguide 6 with apertures 7.1, 7.2 for coupling in microwave or high-frequency energy from a microwave or high-frequency generator, which is not shown. Moreover, each of the two partial devices is provided with a tubular vacuum connection 9.1, 9.2. The coating reactor 10, in which the substrate 2 to be coated is placed, as well as a pump for evacuating the coating chamber 10 are connected to the vacuum connection. In the present case, the pump for evacuating the coating chamber 10 is not shown. A gas supply line 12.1 runs coaxial to the tube axis inside each tubular vacuum connection. The coating reactor 10, in which the substrate 3 to be coated is placed, as well as a pump for evacuating the coating chamber 10 are connected to the vacuum connection. In the present case, the pump for evacuating the costing chamber 10 is not shown. A gas supply line 12.1 runs coaxial to the tube axis inside each tubular vacuum connection.

Similar to the vacuum connection 9.1, 9.2, the coating chamber 10 is substantially tubular. When the partial devices are pulled apart, as shown in FIG. 1, the coating chamber 10 can be placed in the coating device through the opening 14. The coating chamber 10 comprises the connections 9.3 and 9.4 forming a vacuum-tight connection with the vacuum connections 9.1 and 9.2. The coating chamber 10 also comprises two gas supply connections 12.3 and 12.4 which also form a vacuum-tight connection with the gas supply lines 12.1 and 12.2 when the coating chamber 10 is installed.

The microwave energy is coupled into the coating chamber 10 via the microwave windows 16.1 and 16.2, for example.

The advantage of the present coating system is that the coating chamber 10 can be removed allowing that the microwave windows which are also coated after every coating process can be cleaned, for example. Alternatively, a new coating chamber can be used for every eyeglass to be coated. Such a method ensures that the coating conditions are always the same.

FIG. 2 shows the device of the invention in loaded state, i.e. where the coating chamber 10 is installed. Identical components in FIG. 1 have the same reference numbers. FIG. 2 clearly shows that when the two partial devices are moved together in coaxial direction, the vacuum connections 9.3 and 9.4 of the coating chamber 10 form a tight connection with the vacuum connections 9.1 and 9.2 of the first and the second partial device, similar to the gas supply lines 12.3 and 12.4 and the gas supply lines 12.1 and 12.2 of the first and second partial device. FIG. 2 also clearly shows the coaxial arrangement of the gas supply line relative to the vacuum connection. FIG. 2 also shows that the gas supply lines end on opposite sides of the substrate so as to ensure a highly uniform gas supply into the reactor chamber and thus ensuring a more homogeneous coating of the substrate compared to the prior art.

The microwave energy is coupled in via the waveguide 6 with apertures 7.1, 7.2 from a microwave source located outside the device 1. The waveguide 6 is disposed coaxial to the substantially tubular vacuum connection 9.1, 9.2 and to the coating chamber. The waveguide 6 into which the microwave energy is coupled via the apertures 7.1, 7.2 can also be configured rotation-symmetrical, for example as a tube encompassing the coating chamber, similar to the tubular coating chamber 10, which is also called the coating reactor. In the illustrated and above-described embodiment, the tubular waveguide 6, the tubular vacuum connections 9.1, 9.2 and the supply lines 12.1 and 12.2 are concentric and waveguide 6 is concentric with coating chamber 10. Other configurations are also possible without deviating from the invention. The microwave energy supplied by means of the waveguide 6 into the coating reactor or the coating chamber is coupled into the coating chamber 10 in which the substrate 2 is located via microwave windows 16.1, 16.2. The coating is preferably achieved by means of the PICVD method, such as disclosed in DE 38 30 249 C2, for example. According to said method, the gas of a gas atmosphere and a precursor gas are first supplied via the gas supply lines 12.1, 12.2, 12.3 and 12.4 into the interior of the coating reactor 10. Then, by means of the coupled energy, for example high-frequency energy or microwave energy, a plasma is ignited in the interior of the coating reactor 10. In the present embodiment, the plasma is ignited by means of the microwave energy supplied via the waveguide structure 6. The microwave energy supplied by means of the waveguide 6 is coupled into the reactor interior via the electric windows 16.1, 16.2. As described above, the microwave energy is pulsed microwave energy. The advantage of a pulsed plasma is the substantially lower heat load on the substrate to be coated, which is preferably a plastic material. In addition, the activation of the plasma by means of pulsed microwave radiation allows a coating with alternating layers or gradient layers, such as disclosed in U.S. Pat. No. 5,736,207. The precursor gases introduced into the interior of the three-dimensional hollow space or the reactor can comprise HMDSN, HMDSO or $TICl_4$, for example. Conceivable gas atmospheres are a $O_2$ atmosphere, a $N_2$ atmosphere or a $N_2+NH_3$ atmosphere. By means of the pulsed plasma the substrate can be provided on all sides with a coating, for example a $SiO_x$, $TiO_x$ or $SiO_x$ or $Si_xN_y$ coating, preferably having a thickness ranging between 10 and 10000 nm. The device of the invention is the first to allow that a substrate is coated as homogeneously as possible with an optimized volume which is to be filled with gas.

The invention claimed is:

1. A device for coating of substrates, comprising:
a coating chamber;
a first partial device having a first waveguide for coupling in microwave energy, a first gas supply line and a first apparatus for evacuating the coating chamber, a second partial device having a second waveguide for coupling in microwave energy, a second gas supply line and a second apparatus for evacuating the coating chamber;
the first and second partial devices being movable relative to each other, where by means of such moving the coating chamber in which the substrate to be coated is placed can be opened and closed;
the first waveguide for coupling in microwave energy, the first gas supply line and the first apparatus for evacuating the coating chamber are disposed concentric to each other, and the second waveguide for coupling in microwave energy and the second gas supply line and the second apparatus for evacuating the coating chamber are disposed concentric to each other;
the coating chamber being a removable and exchangeable coating chamber;
the removable and exchangeable coating chamber having an internal shape that is symmetrical to the shape of the substrate to be coated and including microwave windows for coupling in microwave energy that are part of the removable and exchangeable coating chamber;
the waveguide and treatment chamber disposed concentric to each other.

2. The device as defined in claim 1, wherein the first and the second gas supply apparatus and the first and the second apparatus for evacuating the coating chamber are disposed opposite each other.

3. The device as defined in claim 2, wherein the substrate to be coated in the coating chamber is a planar or a curved substrate.

4. The device as defined in claim 2, wherein the substrate to be coated is an eyeglass substrate or a lens substrate.

5. The device as defined in claim 1, wherein the substrate to be coated in the coating chamber is a planar or a curved substrate.

6. The device as defined in claim 5, wherein the substrate to be coated is an eyeglass substrate or a lens substrate.

7. The device as defined in claim 1, wherein the diameter or the greatest edge length of the substrate will not exceed 15 cm.

8. The device as defined in claim 7, wherein the substrate to be coated is an eyeglass substrate or a lens substrate.

9. The device as defined in claim 1, wherein the substrate to be coated is an eyeglass substrate or a lens substrate.

10. The device as defined in claim 1, wherein the coating chamber comprises a connection each for the first and the second gas supply line and a connection each for the first and the second apparatus for evacuating the coating chamber.

11. The device as defined in claim 10, wherein the first and the second gas supply lines and the first and the second apparatus for evacuating the coating chamber are disposed opposite each other.

12. The device as defined in claim 10, wherein the substrate to be coated in the coating chamber is a planar or a curved substrate.

13. The device as defined in claim 10, wherein the substrate to be coated is an eyeglass substrate or a lens substrate.

14. The device as defined in claim 10, wherein the connections for the first and second apparatus for evacuating the coating chamber are substantially tubular.

15. The device as defined in claim 10, wherein the first and second gas supply lines run coaxial to an axis of the tubular connection.

16. The device as defined in claim 1, wherein the exchangeable coating chamber has a tubular form.

17. The device as defined in claim 1, wherein the first and second gas supply lines, the first and second apparatus for evacuating the coating chamber and the first and second waveguides are all coaxial with each other.

18. In combination:
   a substrate to be coated, said substrate having a shape;
   a coating chamber;
   a first partial device having a first waveguide for coupling in microwave energy, a first gas supply line and a first apparatus for evacuating the coating chamber, a second partial device having a second waveguide for coupling in microwave energy, a second gas supply line and a second apparatus for evacuating the coating chamber;
   the first and second partial devices being movable relative to each other, where by means of such moving the coating chamber in which the substrate to be coated is placed can be opened and closed;
   the first waveguide for coupling in microwave energy, the first gas supply line and the first apparatus for evacuating the coating chamber are disposed concentric to each other, and the second waveguide for coupling in microwave energy and the second gas supply line and the second apparatus for evacuating the coating chamber are disposed concentric to each other;
   the coating chamber being a removable and exchangeable coating chamber;
   the removable and exchangeable coating chamber having an internal shape that is symmetrical to the shape of said substrate to be coated and including microwave windows for coupling in microwave energy that are part of the removable and exchangeable coating chamber;
   the waveguide and treatment chamber disposed concentric to each other.

19. The combination as defined in claim 18, wherein the exchangeable coating chamber has a tubular form.

20. The combination as defined in claim 18, wherein the coating chamber comprises a connection each for the first and the second gas supply line and a connection each for the first and the second apparatus for evacuating the coating chamber.

21. The combination as defined in claim 20, wherein the connections for the first and second apparatus for evacuating the coating chamber are substantially tubular.

22. The combination as defined in claim 20, wherein the first and second gas supply lines run coaxial to an axis of the tubular connection.

23. The combination as defined in claim 18, wherein the first and second gas supply lines, the first and second apparatus for evacuating the coating chamber and the first and second waveguides are all coaxial with each other.

24. In combination:
   a substrate to be coated, said substrate having a rotationally symmetric shape;
   a tubular coating chamber having an internal shape that is symmetrical to the shape of the substrate;
   a first partial device having a first waveguide for coupling in microwave energy, a first gas supply line and a first apparatus for evacuating the coating chamber, a second partial device having a second waveguide for coupling in microwave energy, a second gas supply line and a second apparatus for evacuating the coating chamber;
   the first and second partial devices being movable relative to each other, where by means of such moving the coating chamber in which the substrate to be coated is placed can be opened and closed;
   the first waveguide for coupling in microwave energy, the first gas supply line and the first apparatus for evacuating the coating chamber are disposed concentric to each other, and the second waveguide for coupling in microwave energy and the second gas supply line and the second apparatus for evacuating the coating chamber are disposed concentric to each other;
   the coating chamber being a removable and exchangeable coating chamber;
   the removable and exchangeable coating chamber having an internal shape that is symmetrical to the shape of said substrate to be coated and including microwave windows for coupling in microwave energy that are part of the removable and exchangeable coating chamber;
   wherein the first and second gas supply lines, the first and second apparatus for evacuating the coating chamber and the first and second waveguides are all coaxial with each other and with said coating chamber;
   the waveguide and treatment chamber disposed concentric to each other.

* * * * *